United States Patent [19]
Laskaris et al.

[11] Patent Number: 5,333,464
[45] Date of Patent: Aug. 2, 1994

[54] COLD HEAD SLEEVE AND HIGH-TC SUPERCONDUCTING LEAD ASSEMBLIES FOR A SUPERCONDUCTING MAGNET WHICH IMAGES HUMAN LIMBS

[75] Inventors: Evangelo T. Laskaris; Kenneth G. Herd, both of Schenectady; Bizham Dorri, Clifton Park, all of N.Y.

[73] Assignee: General Electric Company, Schenectady, N.Y.

[21] Appl. No.: 303

[22] Filed: Jan. 4, 1993

[51] Int. Cl.⁵ .......................... F25B 19/00; H01F 7/22
[52] U.S. Cl. ................................ 62/51.1; 62/259.2; 62/295; 62/297; 335/216; 505/892
[58] Field of Search ............... 62/51.1, 259.2, 295, 62/297; 335/216; 505/892

[56] References Cited

U.S. PATENT DOCUMENTS

| | | | |
|---|---|---|---|
| 4,876,413 | 10/1989 | Vermilyea | 62/51.1 X |
| 4,895,831 | 1/1990 | Laskaris | 505/1 |
| 4,926,647 | 5/1990 | Dorri et al. | 62/51.1 |
| 4,930,318 | 6/1990 | Brzozowski | 62/51.1 |
| 4,986,078 | 1/1991 | Laskaris | 62/51.1 |
| 5,034,713 | 7/1991 | Herd et al. | 62/51.1 X |
| 5,045,826 | 9/1991 | Laskaris | 335/216 X |
| 5,129,232 | 7/1992 | Minas et al. | 62/51.1 |

*Primary Examiner*—Henry A. Bennet
*Assistant Examiner*—Christopher Kilner
*Attorney, Agent, or Firm*—Paul R. Webb, II

[57] ABSTRACT

A cold head sleeve and superconducting lead assembly including a cryocooler and a tube operatively connected to the cryocooler. A first and second heat station are operatively connected to the cryocooler with a magnet cartridge operatively connected to the first heat station and a thermal shield operatively connected to the second heat station. A thermal connector is operatively connected to the magnet cartridge and thermal shield, and a superconducting lead is operatively connected to the thermal connector.

14 Claims, 7 Drawing Sheets

COLD HEAD SLEEVE AND HIGH-TC SUPERCONDUCTING LEAD ASSEMBLIES FOR A SUPERCONDUCTING MAGNET WHICH IMAGES HUMAN LIMBS

BACKGROUND OF THE INVENTION

1. Field of the Invention

This invention relates to cold head sleeve and High-Tc superconducting lead assemblies for use in superconducting magnets. Such structures of this type, generally, provide the proper cold head and superconducting lead characteristics for a superconducting magnet which has a small imaging volume.

2. Description of the Related Art

A variety of cold head sleeve and current lead assemblies have been built and used in conduction-cooled magnetic resonance (MR) imaging magnet systems. Exemplary of such prior art cold head sleeve and current lead assemblies, achieving a modicum of success in this regard are: U.S. Pat. No. 4,895,831, entitled "Ceramic Superconductor Cryogenic Current Lead" to E.T. Laskaris; U.S. Pat. No. 4,926,647, entitled "Cryogenic Precooler and Cryocooler Cold Head Interface Receptacle" to Dorri et al.; and U.S. Pat. No. 4,930,318, entitled "Cryocooler Cold Head Interface Receptacle" to S. J. Brzozowski, all three of which are assigned to the same assignee as the present invention.

As can be seen in the Laskaris patent, the superconducting lead assembly is used in a large, whole body MR imaging system, Consequently, these leads do not provide a compact, low cost design. With respect to the Dorri et al. and Brzozowski patents, the cold heads disclosed in these patents are also used in large, whole body MR imaging systems. Therefore, they would not be capable of providing a low-cost, compact design needed for a superconducting magnet which is used only to image human limbs. A more advantageous cold head sleeve and superconducting lead assemblies, then, would be presented if the cold head sleeve and superconducting lead assemblies were more compact and lower in cost.

It is apparent from the above that there exists a need in the art for a cold head sleeve and High-Tc superconducting lead assembly which is light weight and compact through simplicity of parts and uniqueness of structure, and which at least equals the operation characteristics of the known cold head sleeve and superconducting lead assemblies, particularly those of the highly advantageous type disclosed in the above-referenced Laskaris, Dorri et al. and Brzozowski patents, but which at the same time is capable of providing the performance required by a superconducting magnet that is used only to image human limbs. It is a purpose of this invention to fulfill this and other needs in the art in a manner more apparent to the skilled artisan once given the following disclosure.

SUMMARY OF THE INVENTION

Generally speaking, this invention fulfills these needs by providing a cold head sleeve and superconducting lead assembly, comprising a cryocooler means, a tube means operatively connected to said cryocooler means, a first and second heat station means operatively connected to said cryocooler means, a magnet cartridge means operatively connected to said first heat station means, a thermal shield means operatively connected to said second heat station means, a thermal connector means operatively connected to said magnet cartridge means and said thermal shield means, and a superconducting lead means operatively connected to said thermal connector means.

In certain preferred embodiments, the first heat station means is a 10K heat station. Also, the second heat station means is a 50K heat station. The thermal connector means include 10K and 50K connectors. Finally, the superconducting lead means includes dielectrics, heat sinks and superconducting leads.

In another further preferred embodiment, the cold head sleeve and superconducting lead assembly is light weight and compact such that it can be utilized in a superconducting imaging system which is used only to image human limbs.

The preferred cold head sleeve and superconducting lead assembly, according to this invention, offers the following advantages: lightness in weight; excellent cold head characteristics; excellent superconducting lead characteristics; reduced size; good stability; good durability; good economy; and high strength for safety. In fact, in many of the preferred embodiments, these factors of lightness in weight, excellent cold head characteristics, excellent superconducting lead characteristics, reduced size and good economy are optimized to an extent that is considerably higher than heretofore achieved in prior, known cold head sleeve and superconducting lead assemblies.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several views and in which.

DETAILED DESCRIPTION OF THE INVENTION

Figure 1:
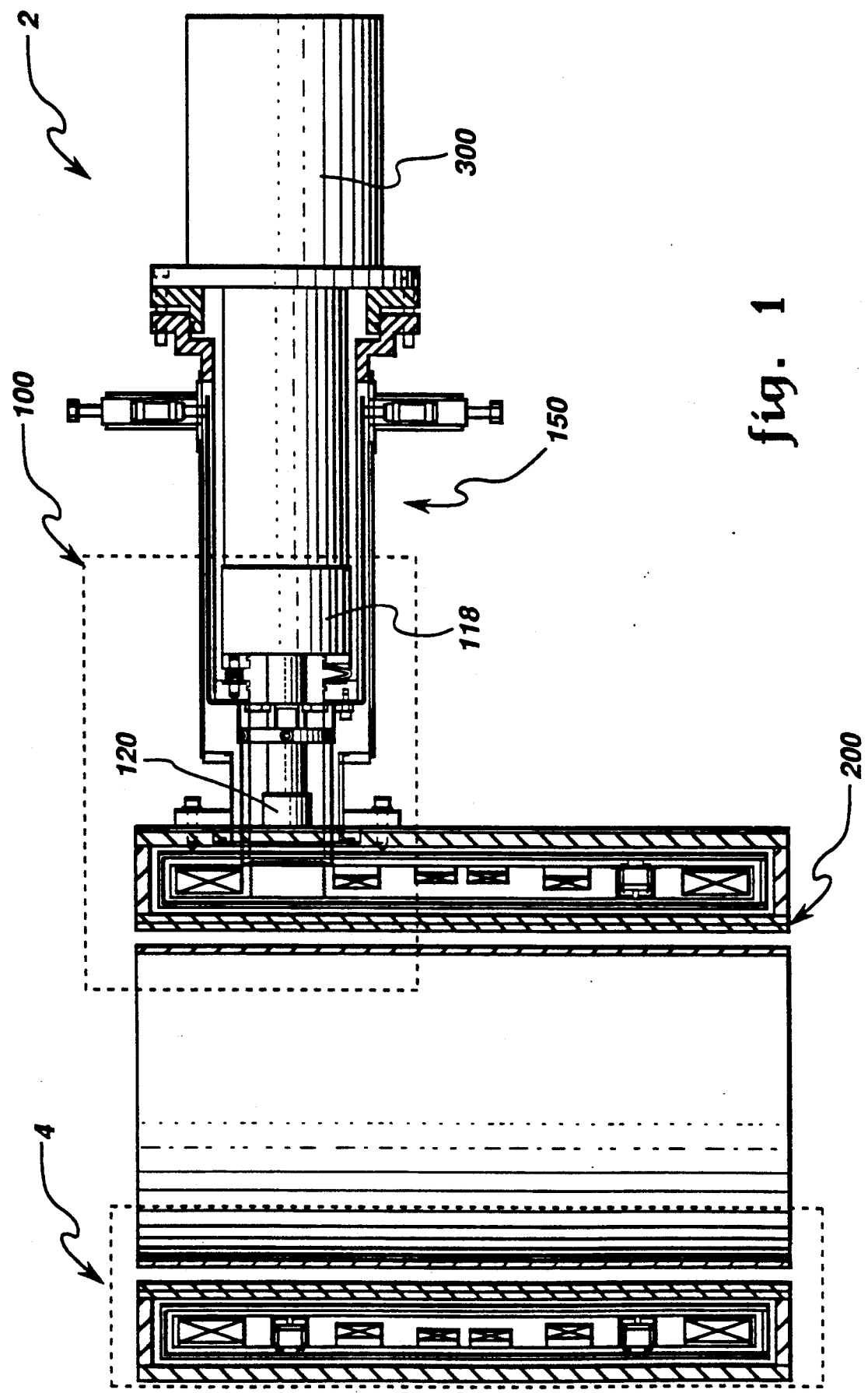
FIG. 1 is a top plan view of an eddy-current free, superconducting imaging magnet for human limbs, according to the present invention.

With reference first to FIG. 1, there is illustrated eddy current-free, superconducting imaging magnet 2 for imaging human limbs. Magnet 2 includes, in part, magnet cartridge assembly 4, High-Tc superconducting lead and magnet support assembly 100, thermal stations 118, 120, cold head sleeve assembly 150, and gradient coil/passive shimming assembly 200 and conventional cryocooler 300.

Figure 2:
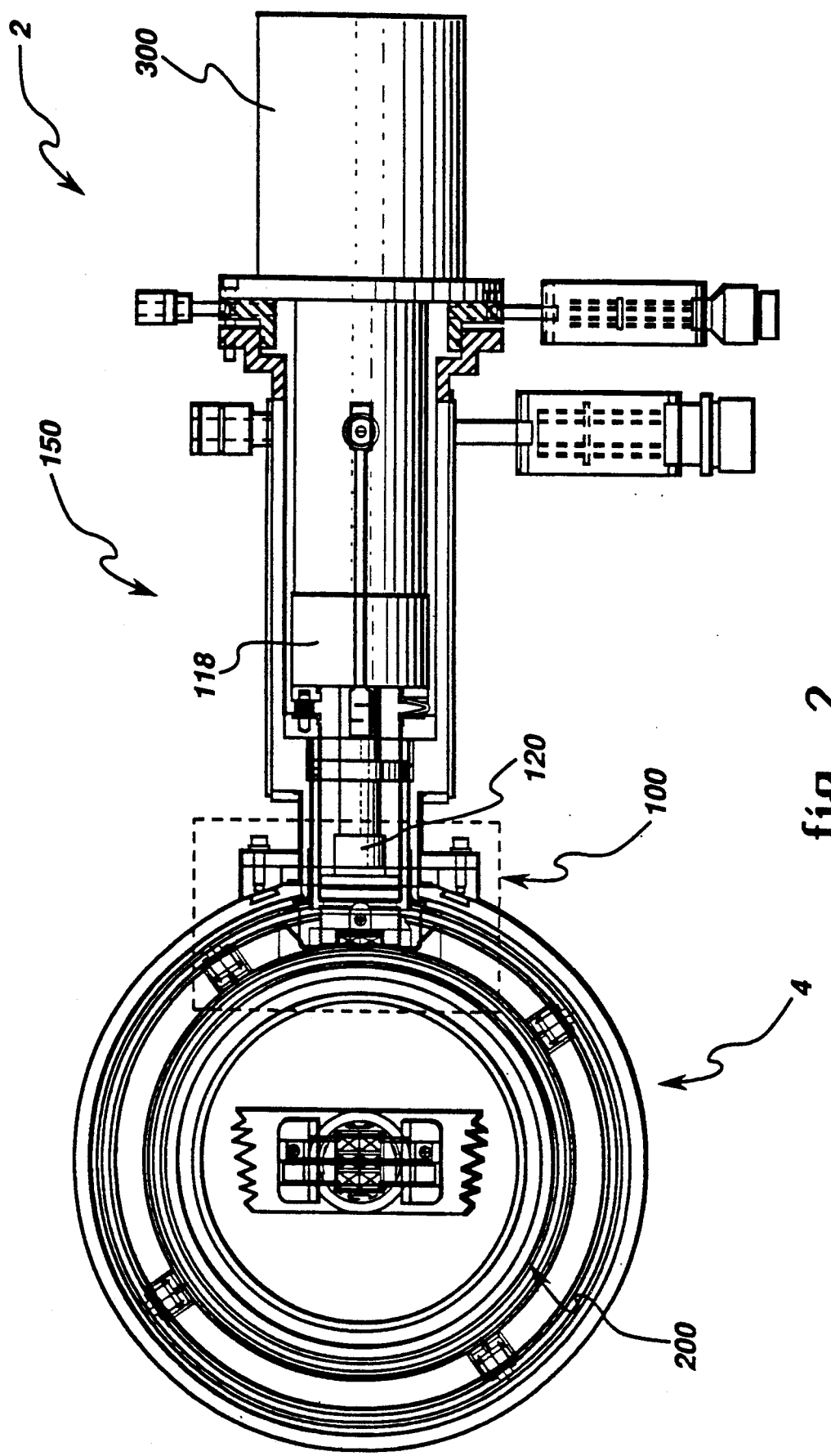
FIG. 2 is a side plan view of the eddy-current free, superconducting imaging magnet for imaging human limbs, according to the present invention.

FIG. 2 is an end view illustration of FIG. 1 in which magnet cartridge assembly 4, High-Tc superconducting lead and magnet support assembly 100, cold head sleeve assembly 150 and gradient coil/passive shim assembly 200 are also illustrated.

Figure 3:
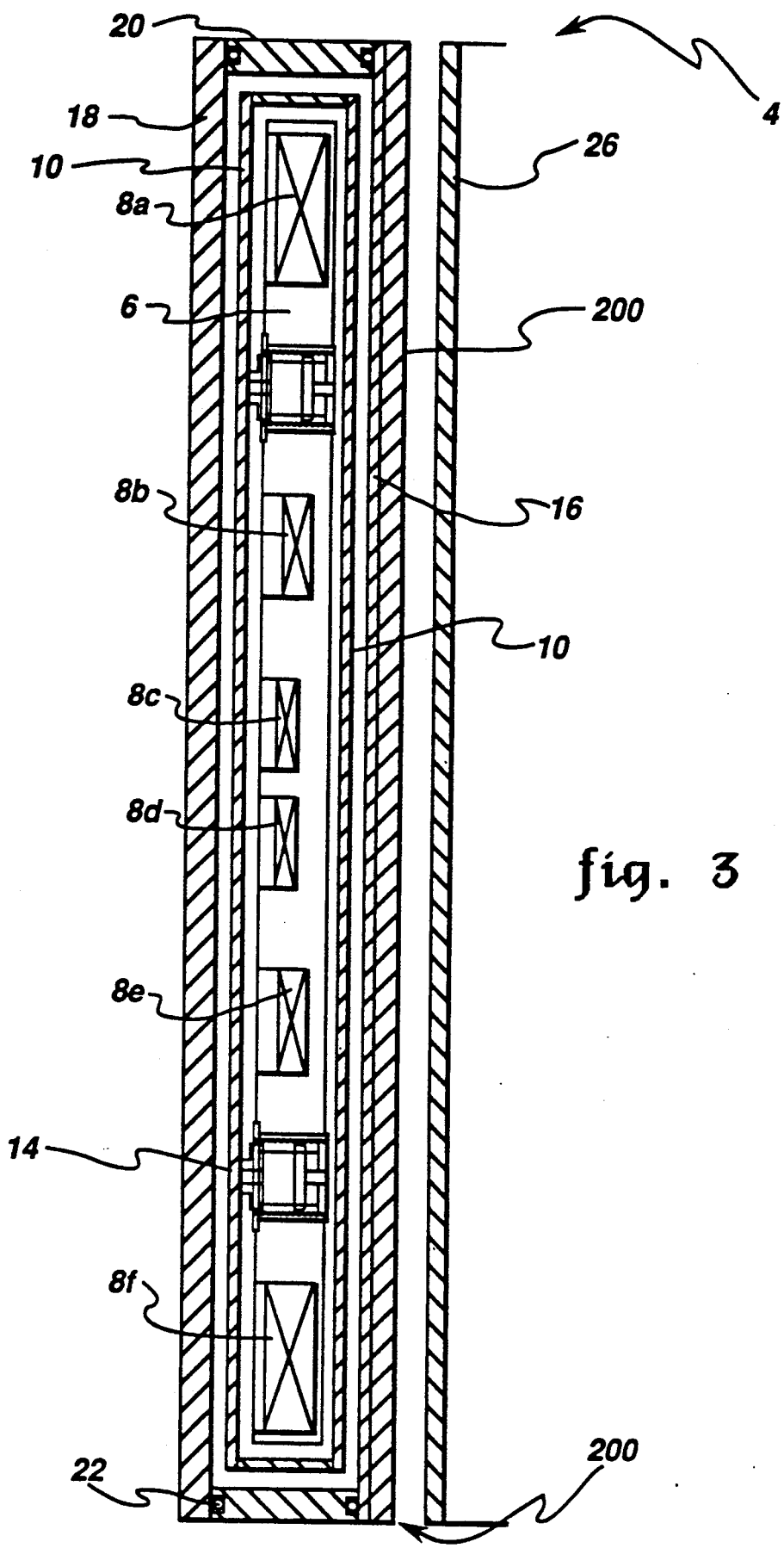
FIG. 3 is an expanded view of the mechanical support and thermal shield assembly for the eddy-current free, superconducting imaging magnet for imaging human limbs.

FIG. 3 is a detailed illustration of magnet cartridge assembly 4 as more generally shown in FIGS. 1 and 2. Magnet cartridge assembly 4 includes, in part, magnet cartridge 6, superconducting coils 8a–8f, thermal shield 10, shield supports 14, inner bore tube 16, vacuum enclosure 18, end plates 20, conventional elastomeric O-rings 22, RF coil 26, and gradient coil/shimming assembly 200. In particular, cartridge 6, preferably, is constructed of any suitable epoxy reinforced fiberglass with copper wires (FIG. 5) for axial thermal conduction. Coil 8a–8f are constructed of any suitable superconducting coil material. Thermal shield 10, preferably, is constructed of any suitable epoxy reinforced fiberglass material and copper wire. Bore tube parts 16, enclosure 18 and end plates 20, preferably, are constructed of any suitable epoxy reinforced material with stainless steel. Supports 14 are used such to rigidly attach thermal shield 10 to cartridge 6 such that heat transference from shield 10 to cartridge 6 can be minimized as magnet 2 is operating.

Figure 4:
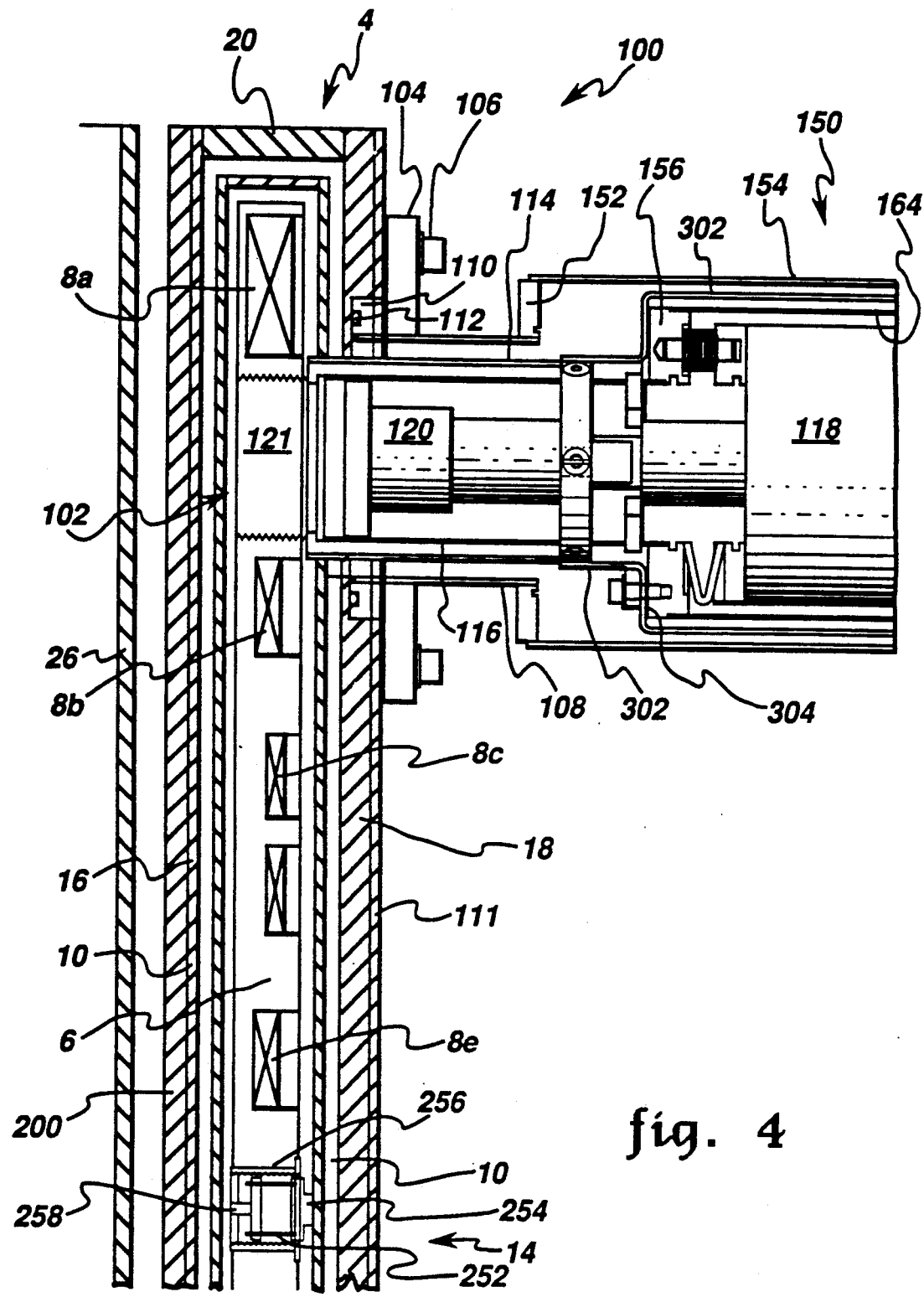
FIG. 4 is an expanded view of a magnet support assembly for the eddy-current free, superconducting imaging magnet for imaging human limbs taken from FIG. 1, according to the present invention.
Figure 5:
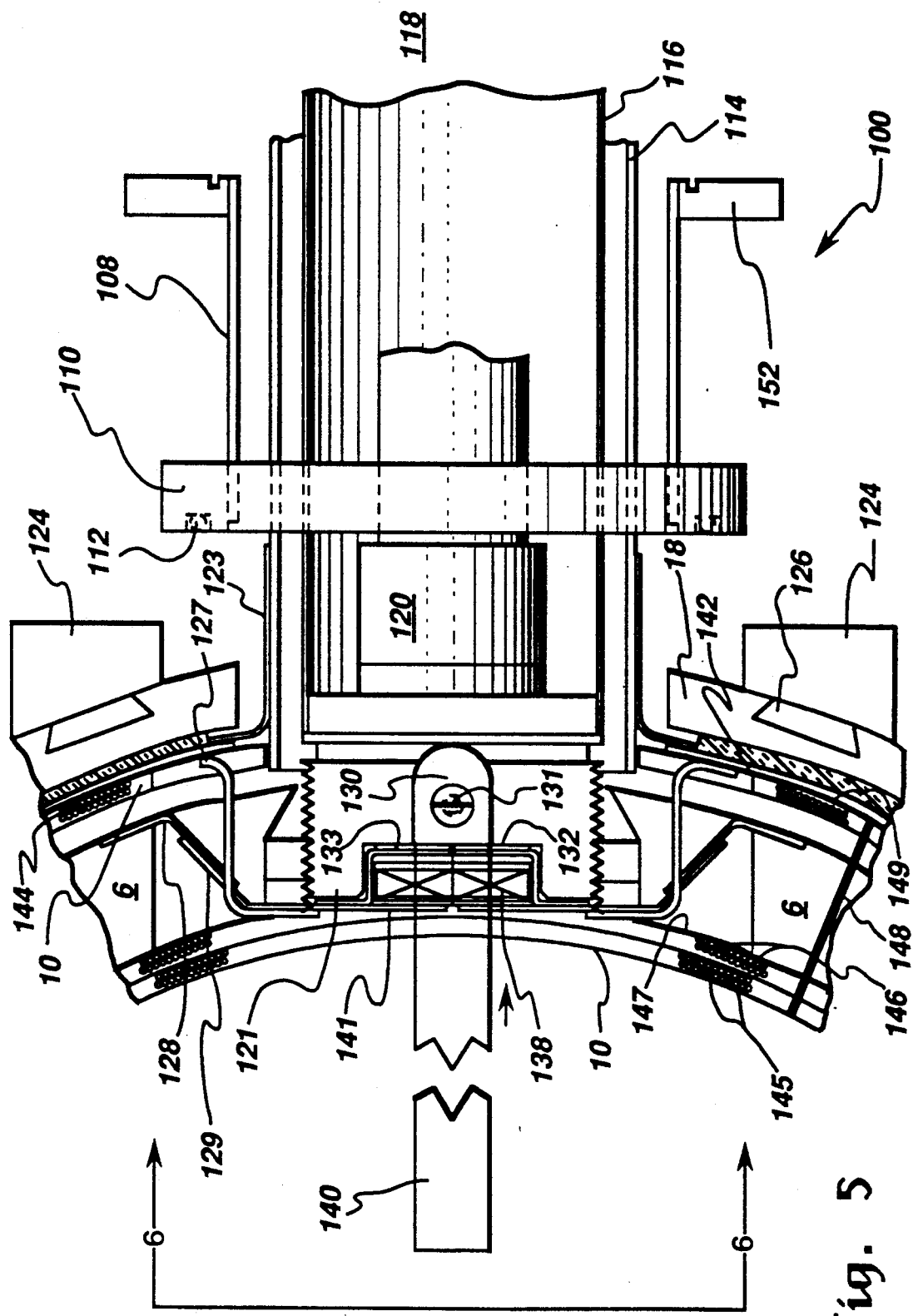
FIG. 5 is an expanded view of a High-Tc superconducting lead assembly for the eddy-current free, superconducting imaging magnet for imaging human limbs taken from FIG. 2, according to the present invention.

FIG. 4 illustrates High-Tc lead and magnet support assembly 100. Assembly 100 includes, in part, magnet cartridge assembly 4, radial shield supports 14, flange 104, tubes 108, 114 and 116, thermal stages 118, 120, connector 121, and passive shim/gradient shield assembly 200. In particular, flange 104, preferably, is constructed of non-magnetic stainless steel (NMSS). Flange 104 is rigidly attached to vacuum enclosure 18 by rails 124 (FIG. 5). Tube 108 which, preferably, is constructed of NMSS is rigidly attached to flange 110 by a conventional weldment (not shown). Flange 110, preferably, is constructed of NMSS. Located between flange 110 and enclosure 18 is a conventional elastomeric O-ring 112. Tube 114, preferably, is constructed of OFHC copper and is rigidly attached to thermal shield 10 by thermal connectors 123 (FIG. 5). Tube 116, preferably, is constructed of NMSS and is rigidly attached to connector 121 by a conventional braze joint (not shown). Connector 121, preferably, is constructed of OFHC copper. Tube 114 is rigidly attached to thermal lead 302 by a conventional solder joint (not shown). Thermal lead 302 preferably, is constructed of OFHC copper. Thermal lead 302 is rigidly attached to dielectric interface 304 by a conventional solder joint (not shown). Interface 304, preferably, is constructed of nickel-plated beryllia. Interface 304 is rigidly attached to flange 156 by a conventional solder joint (not shown).

With respect to radial shield supports 14, supports 250 number four and include, in part, support tube 252, shield contact 254, support housing 256 and support adjustment 258. Tube 252, preferably, is constructed of epoxy reinforced fiberglass. Contact 254, housing 256 and support adjustment 258, preferably, are constructed of brass. Support housing 256 is embedded in magnet cartridge 6 and held by a conventional adhesive. Housing 256 is threaded by conventional threading techniques on its inner diameter and support tube 252 is threaded on its outer diameter by conventional threading techniques to mate with housing 256. Support tube 252 is also threaded on its inner diameter by conventional threading techniques and contact 254 is threaded by conventional threading techniques on its outer diameter to mate with support tube 252. Contact 254 is adhered to tube 252 by a conventional adhesive. Support adjustment 258 is rigidly attached to tube 252 by a conventional adhesive.

In order to adjust the position of shield 10 with respect to cartridge 6, the operator rotates support adjustment 258 to radially raise or lower the position of shield 10. Support 14 provides a low profile, low heat leak shield support.

FIG. 5 illustrates another view of the High-Tc superconducting lead and magnet support assembly 100. As shown in FIG. 5, the assembly 100 includes, in part, magnet cartridge 6, thermal shield 10, vacuum enclosure 18, tubes 108, 114, 116, flange 110, thermal stages 118, 120, rails 124, connector 121, thermal connectors 123, 127, 128, 129, and High-Tc lead 138. In particular, thermal connectors 123, preferably, are constructed of copper and are rigidly attached to tube 114 and thermal shield 10 by conventional solder joints (not shown). Connectors 121, preferably, are constructed of copper and are rigidly attached to magnet cartridge 6 by conventional threaded fasteners and a conventional adhesive (not shown). Rails 124, preferably, are constructed of NMSS and are rigidly retained in outer vacuum enclosure 18 by slots 126. Slots 126 are machined in outer vacuum enclosure 18 by conventional machining techniques. 50K connectors 127 are rigidly attached to thermal shield 10 and connectors 141 by conventional solder joints (not shown). Connectors 127, preferably, are constructed of OFHC copper. 10K connectors 128 are rigidly attached to magnet cartridge 6 by conventional solder joints (not shown). Connectors 129 are rigidly attached to connectors 128 and High-Tc leads 138 by a conventional solder joint (not shown). Dielectrics 132 are rigidly attached to connector 121 by a conventional solder joint (not shown). Dielectrics 132, preferably, are constructed of nickel-plated beryllia. Soldered to dielectrics 132 are heat stations 133. Heat stations 133, preferably, are constructed of copper. Heat stations 133 are rigidly attached to connector 129 by a conventional solder joint (not shown). High-Tc leads 138 are rigidly attached to connectors 141 by a conventional solder joint (not shown). Leads 138, preferably, are constructed of any suitable High-Tc ceramic superconducting material. Thermal connectors 140 are rigidly attached between connector 121 and cartridge 6 by solder joints (not shown). Connectors 140, preferably, are constructed of OFHC copper.

With respect to the eddy-current free nature of magnet 2, U.S. patent application Ser. No. 07/759,389, now allowed, entitled "Eddy Current Free MRI Magnet With Integrated Coil", to Laskaris et al. and assigned to the same assignee describes the nature of the eddy current free technology by teaching that the gradient shield coils may be eliminated in an MRI magnet if all magnet members located on the OD of the gradient coils are constructed such that no eddy current coupling due to the pulsation of the gradient coils can occur. More specifically, no metallic members of low electrical resistance and any substantial width can exist on the magnet enclosure, thermal shield, or magnet cartridge. In particular, calculations are performed to ensure that the eddy current heating as well as the time constants due to eddy current coupling are acceptable for any metallic member which has to be included in the above-mentioned structures.

In cryogen-free conduction cooled magnets, metallic members of high thermal conductivity such as copper or aluminum are used in the construction of the magnet cartridge and thermal shields in order to attain uniform temperatures. In other words, since cooling of the magnet and the thermal shields are done from one location, i.e. cryocooler interface, other areas on the magnet cartridge and thermal shields will not be cooled efficiently unless proper thermal paths are established.

In the present invention, axial thermal conduction in magnet cartridge 6 as well as thermal shield 10 is achieved by attaching by conventional techniques layers of thin, insulated copper wires 142, 144, 146 (0.010 inches in diameter). These wires 142, 144, 145, 146 are closely placed around the circumference of the magnet cartridge 6 and the thermal shield 10, respectively. Wires 144, 145, and 146 run axially from one end to the other end of these members, while wires 142 run circumferentially around thermal shield 10. In particular, wires 142, 144, and 145 are coupled with thermal shield 10 and wires 146 are coupled with cartridge 6.

Circumferential thermal conduction in the magnet cartridge 6 is mostly enhanced by the presence of the superconducting coils 8a–8f. This is due to the fact that these coils 8a–8f are wound with superconducting conductors with copper stabilizer and therefore, the copper stabilizer will contribute to the circumferential thermal conduction. A few, in this case four, thin copper bands 147 of about 0.5 inches width and 0.010 inches thick are attached circumferentially to the magnet cartridge 6 in the location where the cryocooler interface is connected. This is to establish direct thermal communication from the cryocooler 300 to all axial copper wires.

For the thermal shield 10, circumferential copper wires 142 are attached similarly by conventional epoxy joints (not shown) to the axial copper wires 144 for improved thermal conduction. In addition, a multitude of copper tabs 148 of approximately 0.5 inches wide and 0.010 inches thick thermally connect the inner and the outer thermal shield 10 by conventional solder joints (not shown). Finally, two circumferential copper strips 149 of about 0.5 inches wide and about 0.040 inches thick thermally connect the outer thermal shield 10 and the first stage 120 of the cryocooler 300 by conventional solder joints (not shown).

The system mentioned above is an efficient eddy-current free, conduction cooled magnet 2 which provides temperature uniformity on the magnet cartridge 6 and thermal shield 10. At the same time, this magnet 2 has small enough eddy current coupling to the gradient coils 200 which the eddy current heating as well as image distortions are minimum.

Figure 6:
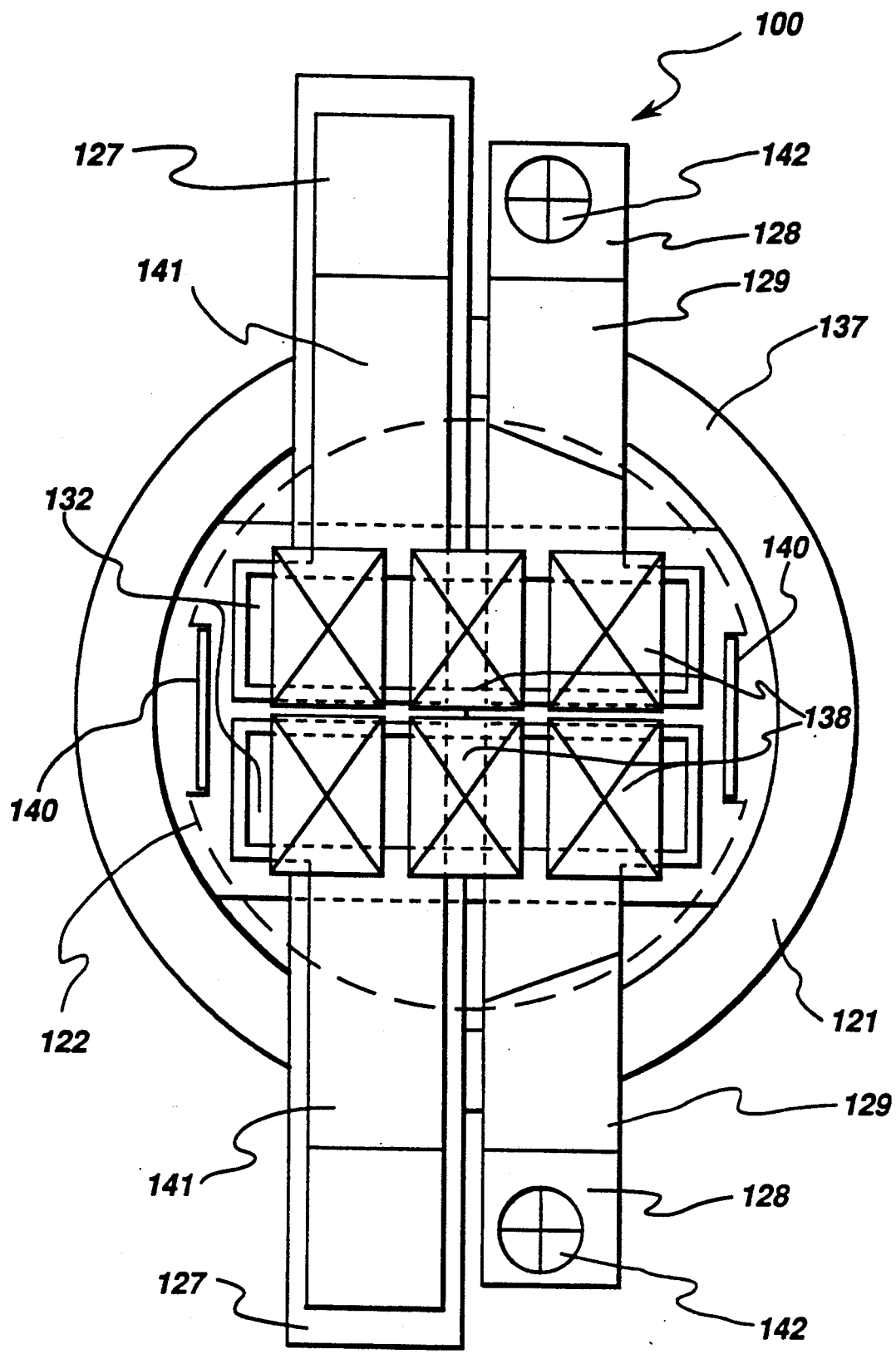
FIG. 6 is an end plan view of the High-Tc superconducting lead assembly for the eddy-current free, superconducting imaging magnet for imaging human limbs taken along line 6—6 of FIG. 5, according to the present invention.

With respect to FIG. 6, there is shown a bottom view of superconducting lead and magnet support assembly 100 taken along lines 6—6 of FIG. 5. In particular, lead and support assembly 100 includes, in part, connector 121, thermal connectors 127, 128, 129, 140, dielectrics 132, High-Tc leads 138, thermal connectors 141, and fasteners 142. In particular, thermal connectors 141, preferably, are constructed of copper and are rigidly attached to thermal connectors 127 by conventional solder joints (not shown). Conventional fasteners 142 are used to attach 10K connectors 128 and 129. Connector 129 is rigidly attached to heat station 133 (FIG. 5) by a conventional solder joint (not shown).

Figure 7:
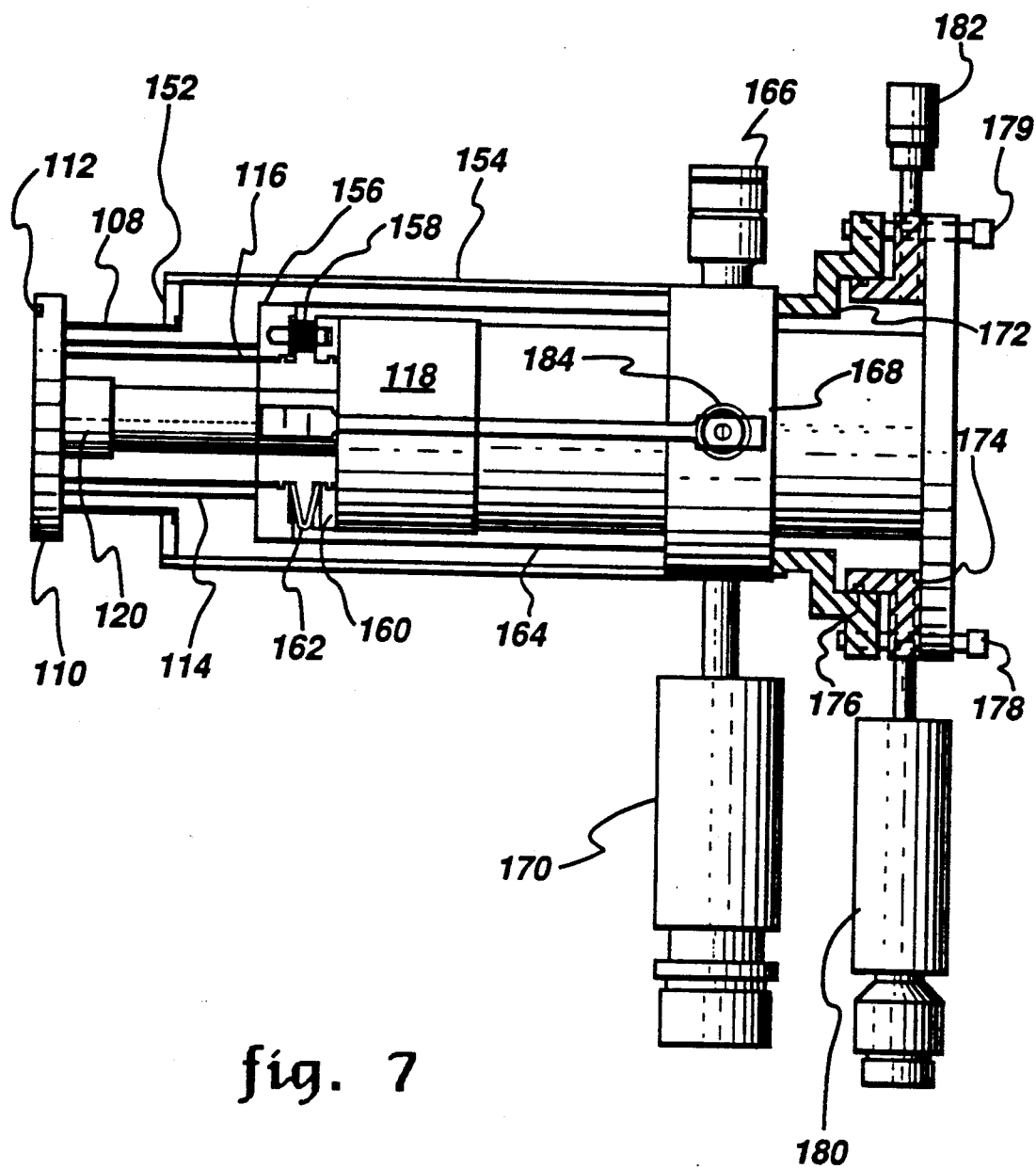
FIG. 7 is a side plan view of the cold head sleeve assembly for the eddy-current free, superconducting imaging magnet for imaging human limbs, according to the present invention.

FIG. 7 illustrates cold head sleeve assembly 150. Assembly 150 includes, in part, tube 108, flange 110, flange 152, tube 154, flange 156, Belleville washer assembly 158, thermal connection 162, tube 164, conventional seal off valve 166, instrument tube 168, conventional connector 170, 300K flange 172, flange 174, conventional connector 180, conventional seal off valve 182 and conventional current lead 184. In particular, flange 152, preferably, is constructed of NMSS and is rigidly attached to tube 108 by a conventional weldment (not shown). Tube 154, preferably, is constructed of NMSS and is rigidly attached to flange 152 and tube 168 by conventional weldments (not shown). Located within tube 154 is tube 164. Tube 164, preferably, is constructed of NMSS. Tube 164 is rigidly attached to flange 172 by a conventional weldment (not shown). Tube 164 is rigidly attached to flange 156 by a conventional braze joint (not shown). Flanges 156 and 160, preferably, are constructed of OFHC copper. A conventional Belleville washer assembly 158 is rigidly attached to flanges 156 and 160 by a conventional press fit. Thermal connection 162 is rigidly attached to flanges 156 and 160 by conventional weldments (not shown). A conventional seal off valve 166 is rigidly attached to tube 168 by a conventional weldment (not shown). A conventional connector 170 is rigidly attached to tube 168 by conventional weldment. Flange 172 is rigidly attached to tube 168 by a conventional weldment (not shown). Located between flange 172 and flange 174 is a conventional elastomeric O-ring 176. Flanges 172, 174, preferably, are constructed of NMSS. A conventional jacking screw 178 is used to lift flange 174 away from flange 172 such that thermal stations 118 and 120 (FIG. 1) become thermally detached from from flange 160 and connectors 121. Conventional connector 180 is rigidly attached to flange 174 by a conventional weldment (not shown). Conventional seal off valve 182 is rigidly attached to flange 174 by a conventional weldment (not shown). Conventional current lead 184 is rigidly attached to flange 168 by a conventional weldment (not shown).

During the operation of cold head sleeve assembly 150, conventional fastener 179 is rotated such that cold head first stage 118 contacts flange 160 and spring assembly 158. Heat from shield 10 (FIG. 3) is conducted along tube 114 to thermal connectors 162 and then directly to the cryocooler 300. Heat from cartridge 6 (FIG. 3) flows through connector 121 to second stage 120 and then directly to the cryocooler 300.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A cold head sleeve and superconducting lead assembly, wherein said assembly is comprised of:
 a cryocooler means;
 a tube means operatively connected to said cryocooler means;

a first and second heat station means operatively connected to said cryocooler means;

a magnet cartridge means operatively connected to said first heat station means;

a thermal shield means operatively connected to said second heat station means;

a thermal connector means operatively connected to said magnet cartridge means and said thermal shield means; and a superconducing lead means operatively connected to said thermal connector means.

2. The assembly, as in claim 1, wherein said tube means if further comprised of:

first, second and third connective tubes.

3. The assembly, as in claim 2, wherein said first tube is operatively connected to said magnet cartridge means and said first thermal station.

4. The assembly, as in claim 2, wherein said second tube is operatively connected to said thermal shield means and said second thermal station.

5. The assembly, as in claim 2, wherein said third tube is operatively connected to an outer bore tube and said cryocooler means.

6. The assembly, as in claim 1, wherein said first heat station means is further comprised of:

a 10 K. thermal heat station.

7. The assembly, as in claim 1, wherein said second heat station means is further comprised of:

a 50 K. thermal heat station.

8. The assembly, as in claim 1, wherein said thermal connection means is further comprised of:

first, second, third and fourth thermal connectors.

9. The assembly, as in claim 8, wherein said assembly is further comprised of:

a contact means operatively connected to said tube means and said thermal connector means.

10. The assembly, as in claim 9, wherein said first thermal connector is operatively connected to said thermal shield means and said contact means.

11. The assembly, as in claim 9, wherein said second and third thermal connectors are operatively connected to said magnet cartridge means and said contact means.

12. The assembly, as in claim 8, wherein said fourth thermal connector is operatively connected to said thermal shield means and said tube means.

13. The assembly, as in claim 1, wherein said assembly is further comprised of:

a clamping plate of rigidly retaining said cold head sleeve assembly in a predetermined position with respect to said superconducting lead assembly.

14. The assembly, as in claim 9, wherein said superconducting lead means is further comprised of:

a flange means operatively connected to said contact means;

a dielectric means operatively connected to said flange means;

a support means operatively connected to said dielectric means; and two superconducting leads operatively connected to said support means.

* * * * *